United States Patent [19]
Stolzenberg

[11] Patent Number: 6,160,689
[45] Date of Patent: Dec. 12, 2000

[54] TWO WIRE SOLID STATE AC/DC CIRCUIT BREAKER

[75] Inventor: Jay Stolzenberg, 449 Ripka St., Philadelphia, Pa. 19128

[73] Assignee: Jay Stolzenberg, Philadelphia, Pa.

[21] Appl. No.: 09/169,051

[22] Filed: Oct. 9, 1998

Related U.S. Application Data

[60] Provisional application No. 60/061,467, Oct. 9, 1997.

[51] Int. Cl.[7] ................................................. H02H 9/00
[52] U.S. Cl. ............................................................. 361/58
[58] Field of Search .............................. 361/57.58, 93.6, 361/100, 101; 307/125, 128, 131

[56] References Cited

U.S. PATENT DOCUMENTS

| | | | |
|---|---|---|---|
| 5,170,310 | 12/1992 | Studtmann et al. | 361/94 |
| 5,831,349 | 11/1998 | Weng | 307/125 |

*Primary Examiner*—Ronald W. Leja
*Attorney, Agent, or Firm*—Charles N. Quinn

[57] ABSTRACT

A two wire solid state AC/DC circuit breaker has a line terminal for connecting the power and the load terminal for connecting to a load. A pair of insulated gate bipolar transistors (IGBTs) are connected in parallel across the line and load terminals in reversed polarity relative to one another. A diode is placed in series with each IGBT limiting current flow to the direction of polarity of the IGBT. Current sensing circuitry is connected across the terminals for sensing current passing through the IGBTs and when a predetermined level has been exceeded, a voltage pulse is generated to the respective bases of the IGBTs to turn them off. This terminates current flow through the respective IGBTs instantaneously.

1 Claim, 2 Drawing Sheets

TWO WIRE SOLID STATE AC/DC CIRCUIT BREAKER

CROSS-REFERENCE TO RELATED APPLICATIONS

This application claims priority under 35 U.S.C. §119(e) (1) to U.S. Provisional Application No. 60/061,467, filed Oct. 9, 1997.

BACKGROUND OF INVENTION

This invention relates to a two wire solid state AC/DC circuit breaker. More specifically the present invention relates to a circuit breaker in which traditional mechanical mechanisms and contacts are replaced with IGBT transistors.

NATURE OF THE PRIOR ART

In the prior art, mechanical circuit breakers have employed moveable switch contacts to open or close circuits in the event of current overload. Such circuit breakers are generally highly reliable, but may involve a complex mechanical system in which the parts are subject to deterioration and wear leading to possible failure. The contacts themselves may deteriorate because wear or damage due to sparking.

In some cases the mechanical circuit breakers are relatively slow in operating. In some cases slow operation can even permit damage before the system responds and the current is discontinued. In some cases there are repeatability problems associated with mechanical overloads due to slower and inconsistent operation of the breaker. Mechanical breaker contacts are also subject to shock and vibration which may make the contact chatter and cause variable effective resistance at the contact surfaces.

In accordance with the present invention a reliable performance is provided by the circuit breaker of the present invention, which may be powered by the voltage drop across the solid state device constituting the circuit breaker. By amplification of that voltage drop, sufficient voltage to trigger a solid state device is provided. The use of the solid state device provides a low cost breaker. The circuitry is simple so that the total cost of the product is small relative to a mechanical breaker. Furthermore, problems relative to contact resistance and contact deterioration are avoided since there are no contacts. The device is nevertheless more responsive and can be tripped essentially instantaneously when a surge or other damaging current condition is detected. Lower cost and improved performance does not require any circuit modification and the breaker can replace a mechanical breaker across the same terminals. Moreover, the fast action and ability to withstand high currents significantly improve protection of the load equipment or personnel involved with the system.

More specifically the present invention involves a two wire solid state AC/DC circuit breaker which has a line terminal for connecting the circuit breaker to power and a load terminal for connecting the circuit breaker to a load, just as a mechanical breaker does. However, the present invention employs a pair of insulated gate bi-polar transistors (IGBTs) in parallel across the line and load terminals and connected in reversed polarity relative to one another. A unidirectional currently flow device is provided in series with each IGBT limiting current flow to the direction of polarity of the IGBT. Current sensing means is connected across the terminal for sensing the current passing through the IGBT's and when a predetermined level has been exceeded, means is provided for providing a voltage pulse to the respective bases of the IGBT's to turn them off, thus instantaneously interrupting current flow through the respective IGBT's.

BRIEF DESCRIPTION OF THE DRAWING

A preferred circuit breaker in accordance with the present invention is shown in the accompanying drawings in which.

DETAILED DESCRIPTION

Figure 1:
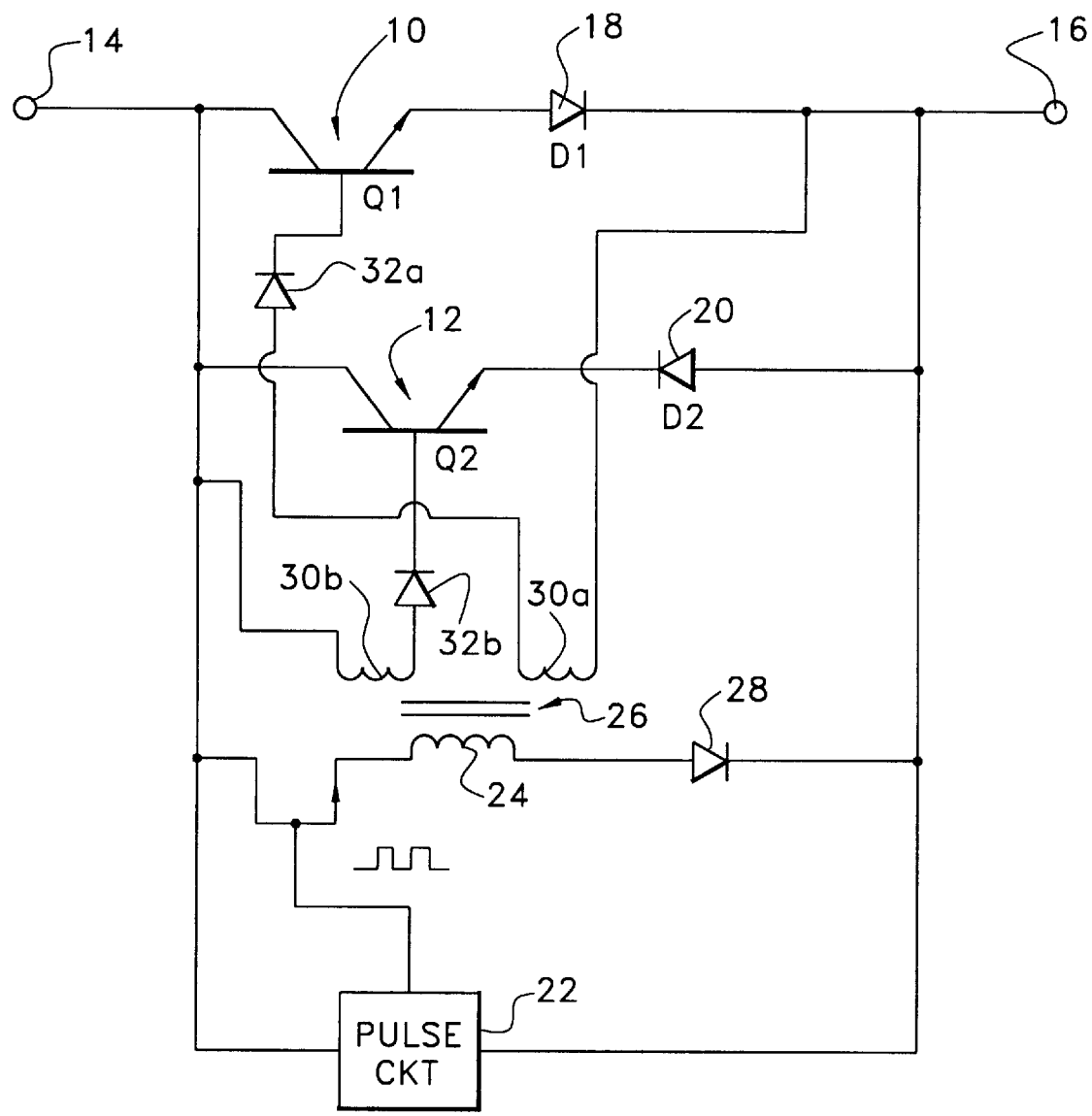
FIG. 1 is a basic schematic drawing showing the essentials of the device of the present invention.

Referring now to FIG. 1, two IGBT's 10 and 12 are connected in opposite polarity across line terminal 14 and load terminal 16 in series with IGBT 10 is blocking diode 18 arranged to permit flow in the same direction as it occurs in the IGBT. In series with IGBT 12 is an oppositely directed blocking diode 20 so that its polarity coincides with that of IGBT 12. Also across terminals 14 and 16 is a pulse generating transistor 23, circuit 22 which produces a square wave as shown acts on transistor 23 provides a switch in another parallel circuit branch across terminals 14 and 16 in series with primary 24 of transformer 26 and blocking diode 28. Pulses of only the polarity required to generate proper potential to the bases of the respective IGBTs are permitted by the diode 28 to flow through this circuit branch. When such pulses occur, they generate potential in the secondaries 30a and 30b to the currents passing through diodes 32a or 32b to the base or gating electrode of IGBT 10 and IGBT 12, respectively. Maintaining sufficient potential at the IGBT bases is necessary to keep them conducting. Alternating current across terminals 14 and 16 will cause current to flow through only one IGBT at a time in the direction permitted by polarity of the IGBT and its diode. A microprocessor 34 is provided to generate a start-up potential to enable the pulse circuit 22 to start operation. The microprocessor 34 is activated by a pulse from a winding on the Hall sensor 40. Once in operation, the pulses generated by the pulse circuit 22 will effectively maintain potential on the bases of the IGBT's to keep them operating.

Figure 2:
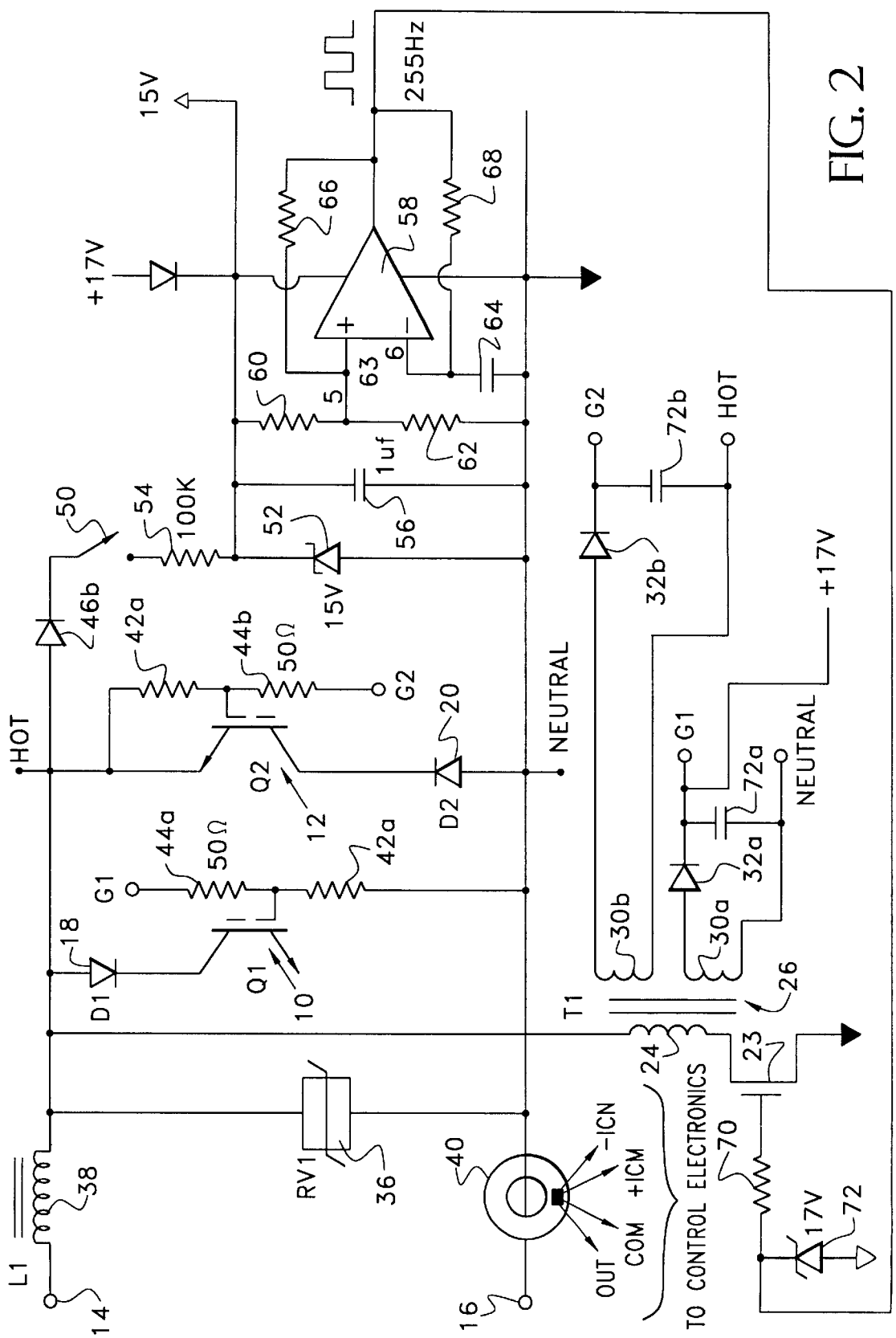
FIG. 2 is a more detailed current circuit diagram showing a preferred version of circuit employing the present invention.

In FIG. 2 a more detailed circuit diagram is shown. Across the power and the load terminals 14 and 16 is placed a voltage limiting device such as a Varistor 36, in parallel with the IGBTs to prevent voltage spikes from exceeding a predetermined voltage level at which the IGBTs might break down. Also connected in series with the power supply terminal 14 is inductor 38, which provides surge protection. The system is intended to reduce the spikes and absorb very high voltages which might be damaging to the system, but still allow spikes and surges to be detected and trip the breaker in appropriate circumstances.

Across the output line to the load terminal 16 is placed a hall sensor 40. The Hall sensor is a magnetic loop which surrounds the conductor carrying output current from the breaker. A ring of magnetic material surrounding the conductor in which current is flowing absorbs flux generated by current in the conductor and through windings around the ring output signals generated by the magnetic field which are proportional to the magnitude of current. The signals may be used to control the breaker or adjust the circuit being protected in some way. One Hall sensor output signal may be directed to microprocessor 34 to provide an input to initiate power generation for start-up. Other outputs may be used for measuring the current which passes through the breaker to the load.

The IGBT's 10 and 12 with their series diodes 18 and 20 are arranged essentially as shown in FIG. 1, except for addition of resistors 42a and 42b, which connect the base to the collector of the respective IGBTs. Resistors 44a and 44b, couple the secondaries 30a and 30b respectively through their diodes 32a and 32b to IGBT bases. The diodes 46a and 46b perform the function of assuring that DC is supplied to the pulse circuit in steady state. The self latching switch 50 may be a momentary pushbutton type device for start-up. The Zener diode 52 assures that the voltage across the pulse generating circuit 22 is limited to 15 volts and the resistor 54 accepts the balance of the voltage which may be applied across the IGBTs. The capacitor 56 is a smoothing capacitor aiding in providing a near steady DC to the pulse circuit.

The pulse circuit is an operational amplifier 58 to whose positive input terminal is connected a junction providing a selected voltage by determined voltage dividing resistors 60 and 62 placed across the 15 volt line. The input terminal of the operational amplifier 58 is connected to the ground or neutral by a capacitor 64. Standard 15 volts and ground potential, respectively, are provided across the amplifier 58 as shown. Feedback is provided from the amplifier output back to the positive terminal through resistor 66 and feedback from the output to the negative terminals through resistor 68. The output of the operational amplifier is a 25 kilohertz squarewave as shown, and is through resistor 70 to the base of field effect transistor 23. A 17 volt limiting Zener diode 72 is connected from the operational amplifier to ground before resistor 70. This Zener effectively protects the field effect transistor 23 by setting a voltage limit to the amplitude of the squarewave signal. Meantime, squarewave is effectively created in the primary coil 24 of transformer 26 by turning off and on repeatedly the current generated across the IGBTs. Then, as in FIG. 1, secondaries 30a and 30b through diodes 32a and 32b provide a DC signal to the base of the each IGBT. Also shown here are smoothing capacitors 72a and 72b, respectively, tending to provide a level of DC input to the bases. In this drawing for clarity the connections G1 and G2 are not shown, but it will be understood similarly designated terminals or connection are normally connected together.

A microprocessor 34 is also used to control the positive terminal of the operational amplifier 58 through terminals or connections G3. This may be accomplished when an overload sensed by the Hall sensor 40 activates the microprocessor to turn on the transistor 74 by applying an appropriate voltage to its base. The positive terminal is thereby connected to ground turning off the amplifier 22, and thus removing the squarewave signal which causes the IGBTs to be conductive. This almost instantaneously "opens" the breaker by rendering the main current paths through the IGBTs non-conductive. The self-latch pushbutton switch 50 releases and must be pushed again to start operation of the breaker and reconnect the circuit.

I claim:

1. A two-wire solid state AC/DC circuit breaker comprising:
   a. a line terminal connecting the circuit breaker to power;
   b. a load terminal connecting the circuit breaker to a load;
   c. a pair of insulating gate bi-polar transistors in parallel across the line and load terminals, connected in reverse polarity to one another;
   d. unidirectional means in series with each insulated gate bi-polar transistors for limiting current flow to the direction of polarity of the respective insulated gate bi-polar transistors;
   e. means connected across said terminals for sensing current passing through the insulated gate bi-polar transistors;
   f. means for providing voltage pulses to respective bases of the insulated gate bi-polar transistors responsively to said current sensing means detecting current above a preselected level thereby instantaneously interrupting current flow through respective insulated gate bi-polar transistors;
   g. means connected across said line and load terminals for generating pulses and providing the same to bases of each of said insulated gate bi-polar transistors at a potential to keep said insulated gate bi-polar transistors sequentially conducting, comprising:
      i. means for generating square waves for input to a transistor;
      ii. said transistor receiving said square waves and providing signals to bases of said insulated bi-polar transistors to alternatingly cause those insulated bi-polar transistors to conduct.

* * * * *

UNITED STATES PATENT AND TRADEMARK OFFICE
CERTIFICATE OF CORRECTION

PATENT NO : 6,160,689
DATED : December 12, 2000
INVENTOR(S) : Stolzenberg Jay

It is certified that error appears in the above-identified patent and that said Letters Patent are hereby corrected as shown below:

On title page, item 73 Assignee
replace "Jay Stolzenberg"
with --SPD Technologies Inc.--.

Signed and Sealed this

Eighth Day of May, 2001

Attest:

NICHOLAS P. GODICI

*Attesting Officer*   Acting Director of the United States Patent and Trademark Office